(12) United States Patent
Liu

(10) Patent No.: US 12,326,664 B2
(45) Date of Patent: Jun. 10, 2025

(54) DOSE MAPPER METHOD

(71) Applicant: Shanghai Huali Integrated Circuit Corporation, Shanghai (CN)

(72) Inventor: Shuo Liu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 560 days.

(21) Appl. No.: 17/848,498

(22) Filed: Jun. 24, 2022

(65) Prior Publication Data

US 2022/0413393 A1 Dec. 29, 2022

(30) Foreign Application Priority Data

Jun. 29, 2021 (CN) .......................... 202110723738.0

(51) Int. Cl.
*G03F 7/00* (2006.01)
(52) U.S. Cl.
CPC .......... *G03F 7/70625* (2013.01); *G03F 7/705* (2013.01); *G03F 7/70508* (2013.01)
(58) Field of Classification Search
CPC .. G03F 7/70625; G03F 7/705; G03F 7/70508; G03F 7/70558
See application file for complete search history.

(56) References Cited

U.S. PATENT DOCUMENTS

| 2020/0026200 | A1* | 1/2020 | Wildenberg | ............ G03F 7/705 |
| 2020/0401052 | A1* | 12/2020 | Weijden | .................. H01L 22/20 |
| 2021/0241449 | A1* | 8/2021 | Wang | ..................... G06T 7/0004 |
| 2021/0311400 | A1* | 10/2021 | Kamali | ............... G03F 7/70525 |
| 2021/0382400 | A1* | 12/2021 | Anunciado | ......... G03F 7/70491 |

\* cited by examiner

*Primary Examiner* — Stewart A Fraser
(74) *Attorney, Agent, or Firm* — Banner & Witcoff, Ltd.

(57) ABSTRACT

The present application discloses a dose mapper method, which includes: step 1: collecting critical dimension fingerprint of each tool and each mask and storing the critical dimension fingerprint in a database; step 2: before exposing a wafer, pre-selecting the tool and the mask to be used, selecting the corresponding critical dimension fingerprint from the database and combining the corresponding critical dimension fingerprint to form total critical dimension fingerprint; step 3: obtaining dose mapper data for exposure of the wafer according to the total critical dimension fingerprint; step 4: exposing the wafer, and correcting the exposure of the wafer according to the dose mapper data in an exposure process. The present application can quickly and easily generate a dose mapper data file, especially when there is a new tool or mask to be expanded, thus improving the efficiency of generating the dose mapper data file and improving the production capacity.

6 Claims, 4 Drawing Sheets

DOSE MAPPER METHOD

CROSS-REFERENCES TO RELATED APPLICATIONS

This application claims the priority to Chinese patent application No. 202110723738.0, filed on Jun. 29, 2021, the disclosure of which is incorporated herein by reference in its entirety.

TECHNICAL FIELD

The present application relates to a method for manufacturing a semiconductor integrated circuit, in particular to a dose mapper (DOMA) method.

BACKGROUND

The lithography layer in semiconductor integrated circuit manufacturing needs to be patterned through lithography and etching processes. The lithography process forms a photoresist pattern through exposure and development, and then carries out After Development Inspection (ADI) and obtains ADI Critical Dimension (CD); after that, etching and After Etch Inspection (AEI) are carried out to obtain AEI CD.

The After Etch Inspection Critical Dimension Uniformity (AEI CDU) of the key lithography layer is a key parameter closely related to the chip yield. DOMA function is a widely used method to correct the distribution difference of AEI CD on the wafer at the technical node below 40 nm. The basic principle of DOMA is to adjust the CD at different positions on the wafer by adjusting the exposure energy at different positions on the wafer during lithography, so as to obtain the best AEI CDU. Since what is corrected through DOMA is the fingerprint of CD brought by the combination of LITHO tool, mask and etch tool, the DOMA correction file is associated with the LITHO tool, the mask and the ETCH tool, and the combination of each LITHO tool, each mask and each ETCH tool corresponds to a unique DOMA correction file. When a new tool and mask need to be expanded on the production line, a large amount of AEI CD data needs to be collected to obtain DOMA correction files corresponding to different tool combinations, which seriously influences the efficiency of tool expansion and occupies the capacity of the online measuring tool.

Referring to FIG. 1, it illustrates a flowchart of an existing dose mapper (DOMA) method, which includes the following steps:

In step S101, a wafer requiring lithography and etching is provided.

In step S102, dose uncorrected exposure is performed on a LITHO tool.

In step S103, etching is performed on an ETCH tool.

In step S104, AEI measurement is performed to obtain AEI CD data.

In step S105, CD analysis is performed according to the AEI CD data.

In step S106, the CD analysis result in step S105 and the dose sensitivity 301 are combined to obtain a Dose Recipe (DR). The DR corresponds to the DOMA file.

Then, DOMA is performed according to the DR, and then step S102 is performed according to the corrected dose.

Referring to FIG. 2, it illustrates a corresponding relationship diagram between DOMA files and various combinations of LITHO tools, masks and ETCH tools in the existing DOMA method. FIG. 2 illustrates three LITHO tools 101a, 101b and 101c, two masks 102a and 102b, and three ETCH tool 103a, 103b and 103c.

Assuming that the ETCH tool 103c is a newly added tool, in order to obtain a DOMA file related to the ETCH tool 103c, there are six combinations between the ETCH tool 103c, the three LITHO tools 101a, 101b and 101c and the two masks 102a and 102b. The six combinations in FIG. 2 are connected together by using corresponding arrow lines respectively. In this way, it is necessary to repeat steps S101 to S106 six times. The AEI CD data obtained in step S104 six times correspond to AEI CD 104a, 104b, 104c, 104d, 104e and 104f respectively in FIG. 2, and the dose recipes obtained in step S106 six times correspond to dose recipes 105a, 105b, 105c, 105d, 105e and 105f respectively in FIG. 2.

It can be seen from the above that in the case of three LITHO tools and two masks, for each additional ETCH tool, the AEI CD data of at least six combinations need to be collected to obtain the ODMA files related to the newly added ETCH tool. If there are more LITHO tools and masks, it is obvious that more AEI CD data need to be collected, which will seriously influence the expansion efficiency of the tool and occupy the capacity of the online measuring tool.

BRIEF SUMMARY

The technical problem to be solved by the present application is to provide a dose mapper (DOMA) method, which can quickly and easily generate a DOMA data file, and especially when there is a new tool or mask to be expanded, can improve the efficiency of generating the DOMA data file and thus improve the production capacity.

In order to solve the above technical problem, the DOMA method provided by the present application includes the following steps:

step 1: collecting critical dimension fingerprints of each tool and each mask and storing the collected critical dimension fingerprints in a database;

step 2: before exposing a wafer, pre-selecting the tool and the mask to be used, selecting the corresponding critical dimension fingerprints from the database according to the selected tool and mask, and combining the corresponding critical dimension fingerprints to form a total critical dimension fingerprint;

step 3: obtaining DOMA data for exposure of the wafer according to the total critical dimension fingerprint;

step 4: exposing the wafer, and correcting the exposure of the wafer according to the DOMA data in an exposure process of the wafer.

As a further improvement, the tool includes a LITHO tool and an ETCH tool.

As a further improvement, the number of the LITHO tool is more than one, the number of the ETCH tool is more than one and the number of the mask is more than one.

As a further improvement, the critical dimension fingerprint of each LITHO tool and the critical dimension fingerprint of each mask are obtained through the following steps:

step 11: selecting one LITHO tool and one mask, and performing exposure and development to obtain corresponding ADI CD data;

step 12: decomposing the obtained ADI CD data to obtain the critical dimension fingerprint of the selected LITHO tool and the critical dimension fingerprint of the selected mask;

step 13: changing the combination of the selected LITHO tool and the selected mask, repeating steps 11-12 until the critical dimension fingerprints of all LITHO tools and all masks are obtained, and storing the critical dimension fingerprints in the database.

As a further improvement, when there is a newly added LITHO tool, the critical dimension fingerprint of the newly added LITHO tool is obtained separately by using the following steps:

using the newly added LITHO tool as the selected LITHO tool, and repeating steps 11-12 to obtain the critical dimension fingerprint of the newly added LITHO tool.

As a further improvement, when there is a newly added mask, the critical dimension fingerprint of the newly added mask is obtained separately by using the following steps:

using the newly added mask as the selected mask, and repeating steps 11-12 to obtain the critical dimension fingerprint of the newly added mask.

As a further improvement, the critical dimension fingerprint of each ETCH tool is obtained through the following steps:

step 14: arbitrarily selecting one LITHO tool that the critical dimension fingerprint has been obtained and arbitrarily selecting one mask that the critical dimension fingerprint has been obtained;

step 15: performing exposure and development by using the selected LITHO tool and the mask, then performing etching by using the selected ETCH tool after development, and obtaining the corresponding AEI CD data;

step 16: removing the critical dimension fingerprint of the selected LITHO tool and the critical dimension fingerprint of the selected mask from the obtained AEI CD data to obtain the critical dimension fingerprint of the selected ETCH tool;

step 17: changing the selected LITHO tool, repeating steps 14-16 or repeating steps 15-16 until the critical dimension fingerprints of all ETCH tools is obtained, and storing the obtained critical dimension fingerprints in the database.

As a further improvement, when there is a newly added ETCH tool, the newly added ETCH tool is used as the selected LITHO tool, and steps 14-16 or steps 15-16 are repeated until the critical dimension fingerprint of the newly added ETCH tool is obtained.

As a further improvement, in step 2, the total critical dimension fingerprint is an AEI CD fingerprint formed after exposing and etching the wafer.

As a further improvement, in step 1, a set of critical dimension fingerprints of each tool and each mask is collected on each lithography layer.

By collecting the CD fingerprints of each tool and mask in advance, the present application can select the corresponding CD fingerprints from the database according to the selected tool and mask in advance before exposure, and combine the selected CD fingerprints to form a total CD fingerprint. Dose mapper data can be obtained through the total CD fingerprint, so as to quickly and easily generate the DOMA data file.

Especially when a new tool or mask needs to be expanded, different from the DOMA data file that requires multiple combination tests between the new tool or mask and other tools or masks in the prior art, the present application only needs to calculate the CD fingerprint of the added tool or mask to generate the DOMA data file related to the new tool or mask, thus improving the efficiency of generating the DOMA data file and improving the production capacity.

BRIEF DESCRIPTION OF THE DRAWINGS

The present application will be described in further detail below in combination with the specific embodiments with reference to the drawings.

DETAILED DESCRIPTION

Figure 1:
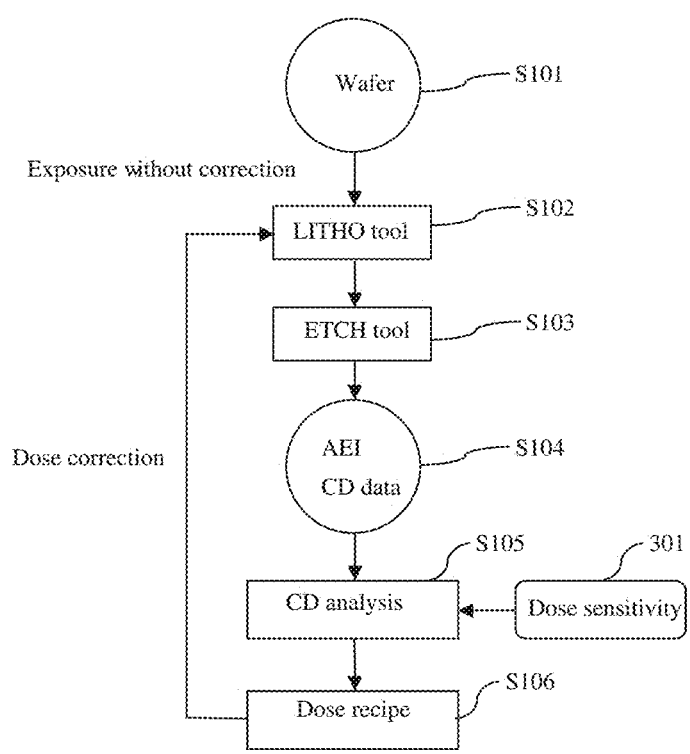
FIG. 1 illustrates a flowchart of an existing dose mapper (DOMA) method.
Figure 2:
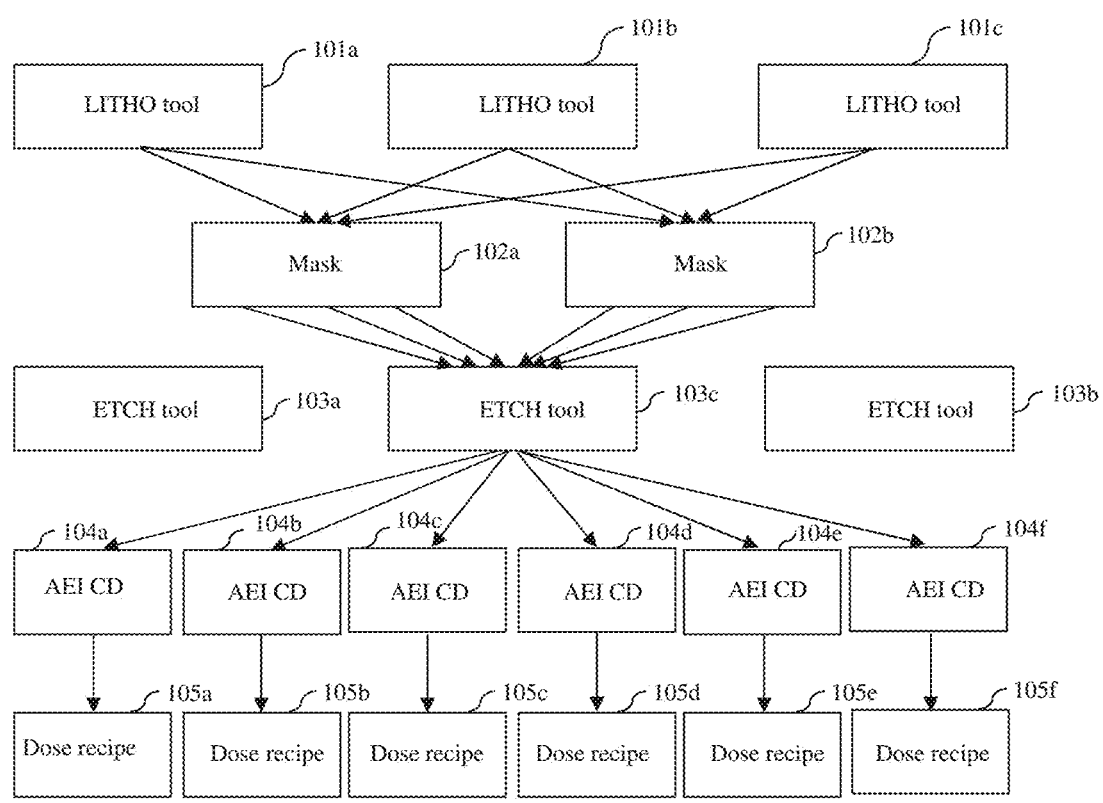
FIG. 2 illustrates a corresponding relationship diagram between DOMA files and various combinations of LITHO tools, masks and ETCH tools in an existing DOMA method.
Figure 3:
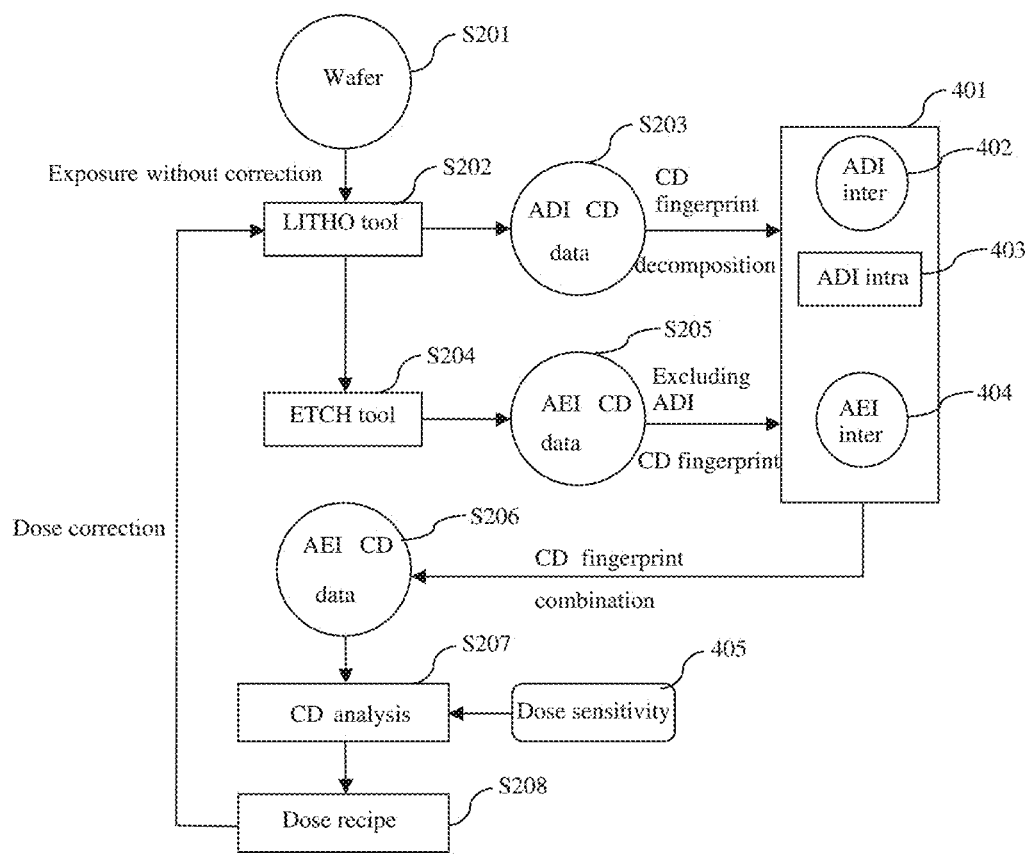
FIG. 3 illustrates a flowchart of a DOMA method according to an embodiment of the present application.
Figure 4:
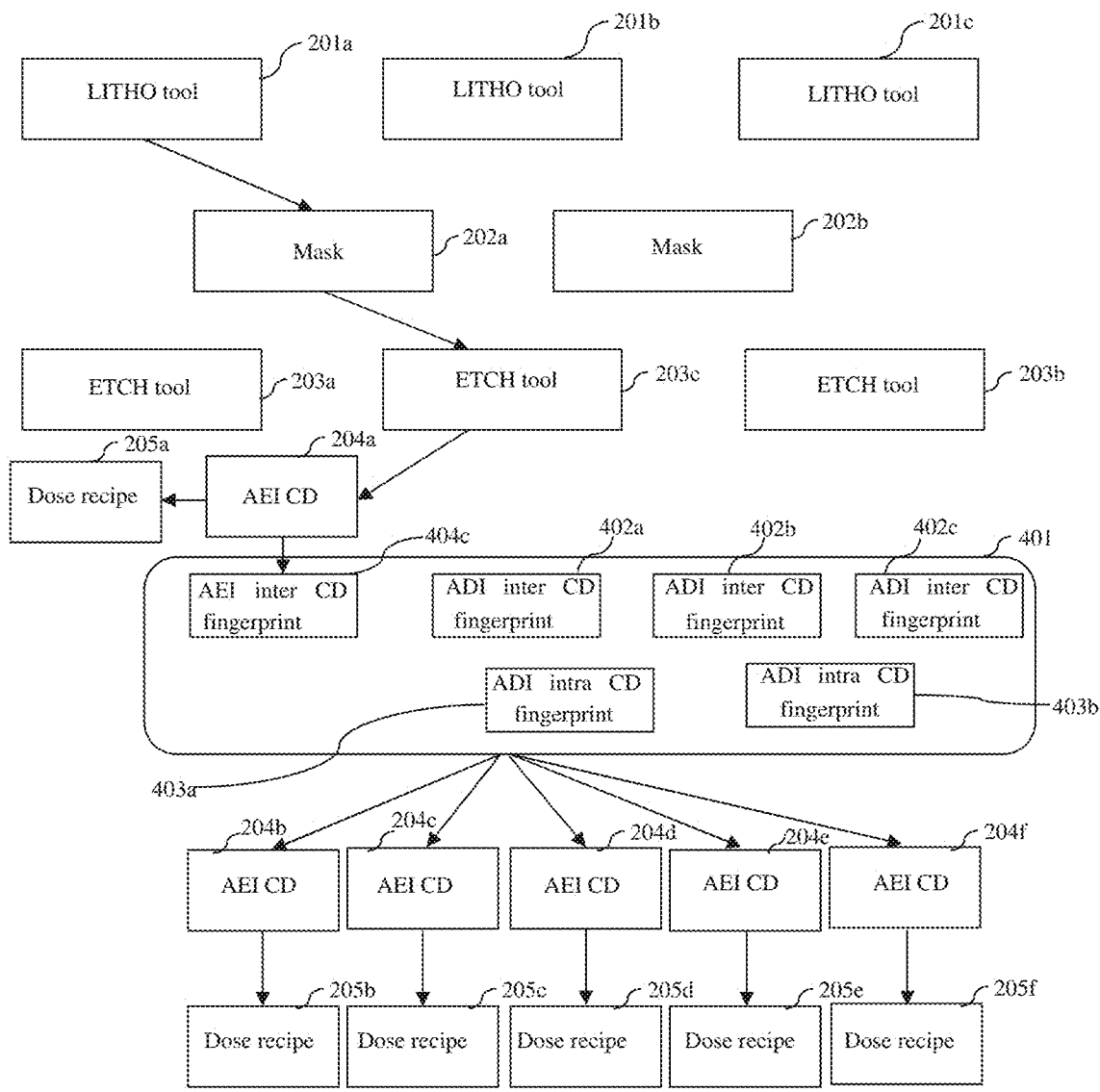
FIG. 4 illustrates a diagram of ways of forming various DOMA files when an ETCH tool is added in a DOMA method according to an embodiment of the present application.

Referring to FIG. 3, it illustrates a flowchart of a dose mapper (DOMA) method according to an embodiment of the present application. Referring to FIG. 4, it illustrates a diagram of ways of forming various DOMA files when an ETCH tool is added in a DOMA method according to an embodiment of the present application. The DOMA method according to the embodiment of the present application includes the following steps:

In step 1, critical dimension fingerprints of each tool and each mask are collected and the collected critical dimension fingerprints are stored in a database 401.

In the embodiment of the present application, the tool includes a LITHO tool and ETCH tool.

The number of the LITHO tool is more than one, the number of the ETCH tool is more than one and the number of the mask is more than one. FIG. 4 illustrates three LITHO tools 201a, 201b and 201c, two masks 202a and 202b, and three etch tools 203a, 203b and 203c.

Generally, a plurality of lithography layers are included in the whole production process of the same wafer product, and a set of critical dimension fingerprints of each tool and each mask is collected on each lithography layer.

The critical dimension fingerprint of each LITHO tool and the critical dimension fingerprint of each mask are obtained through the following steps:

In step 11, one LITHO tool and one mask are selected, and exposure is performed to obtain corresponding ADI CD data. Step 11 corresponds to steps S201 to S203 in FIG. 3. Step S201 is to perform dose uncorrected exposure and development to the provided wafer. Step S203 is to measure the critical dimension of the wafer after exposure and development, that is, perform ADI CD measurement.

The ADI CD measurement method may be selected according to the characteristics of different lithographic layers.

In step 12, the obtained ADI CD data is decomposed to obtain the critical dimension fingerprint of the selected LITHO tool and the critical dimension fingerprint of the selected mask. In FIG. 3, the ADI CD data obtained in step S203, i.e., the ADI critical dimension data is subjected to critical dimension fingerprint decomposition to obtain the critical dimension fingerprint of the LITHO tool and the critical dimension fingerprint of the selected mask. ADI inter 402 represents the critical dimension fingerprint of the LITHO tool. ADI intra 403 represents the critical dimension fingerprint of the mask.

In step 12, the critical dimension fingerprint of the selected LITHO tool and the critical dimension fingerprint of the selected mask are obtained by fitting the ADI CD data or other methods.

In step 13, the combination of the selected LITHO tool and the selected mask is changed, steps 11-12 are repeated until the critical dimension fingerprints of all LITHO tools and all masks are obtained, and the critical dimension fingerprints are stored in the database 401.

When there is a newly added LITHO tool, the critical dimension fingerprint of the newly added LITHO tool is obtained separately by using the following steps:

using the newly added LITHO tool as the selected LITHO tool, and repeating steps 11-12 to obtain the critical dimension fingerprint of the newly added LITHO tool.

When there is a newly added mask, the critical dimension fingerprint of the newly added mask is obtained separately by using the following steps:

using the newly added mask as the selected mask, and repeating steps 11-12 to obtain the critical dimension fingerprint of the newly added mask.

The critical dimension fingerprint of each ETCH tool is obtained through the following steps:

In step 14, one LITHO tool that the critical dimension fingerprint has been obtained is arbitrarily selected and one mask that the critical dimension fingerprint has been obtained is arbitrarily selected.

In step 15, exposure and development are performed by using the selected LITHO tool and the mask, that is, steps S201 and S202 in FIG. 3 are performed.

Then etching is performed by using the selected ETCH tool after development. This step corresponds to step S204 in FIG. 3. The corresponding AEI CD data, i.e., AEI critical dimension data is obtained. This step corresponds to step S205 in FIG. 3. In step S205, AEI CD measurement is performed to obtain AEI CD data.

In step 16, the critical dimension fingerprint of the selected LITHO tool and the critical dimension fingerprint of the selected mask are removed from the obtained AEI CD data to obtain the critical dimension fingerprint of the selected ETCH tool. The arrow line in step S205 in FIG. 3 illustrates the obtained critical dimension fingerprint of the selected ETCH tool after removing the ADI critical dimension fingerprint, the critical dimension fingerprint of the LITHO tool corresponding to the ADI critical dimension fingerprint and the critical dimension fingerprint of the mask. In FIG. 3, AEI inter 404 in the database 401 represents the critical dimension fingerprint of the ETCH tool.

In step 16, the critical dimension fingerprint of the selected ETCH tool is obtained by fitting and calculating the AEI CD data or other methods.

In step 17, the selected LITHO tool is changed, steps 14-16 are repeated or steps 15-16 are repeated until the critical dimension fingerprints of all ETCH tools is obtained, and the obtained critical dimension fingerprints are stored in the database 401. The data storage mode of the critical dimension fingerprints in the database may be adjusted according to the actual situation.

When there is a newly added ETCH tool, the newly added ETCH tool is used as the selected LITHO tool, and steps 14-16 or steps 15-16 are repeated until the critical dimension fingerprint of the newly added ETCH tool is obtained.

In FIG. 4, it is assumed that the ETCH tool 203c is a newly added ETCH tool, the selected LITHO tool in step 14 is the LITHO tool 201a and the selected mask is the mask 202a. In FIG. 4, the arrow lines are adopted to represent the combination relationship of the LITHO tool, the mask and the ETCH tool. Obviously, the embodiment of the present application can be implemented by only one combination. The AEI CD data of such combination obtained in step 15 is illustrated as AEI CD 204a in FIG. 4. In step 16, the critical dimension fingerprint of the ETCH tool 203c can be obtained according to the AEI CD 204a. In FIG. 4, the critical dimension fingerprint of the ETCH tool 203c is represented by the AEI inter CD fingerprint 404c. At the same time, a dose recipe 205a can also be obtained according to the AEI CD 204a. The dose recipe 205a is a dose recipe corresponding to the combination of the LITHO tool 201a, the mask 202a and the ETCH tool 203c.

In step 2, before exposing a wafer, the tool and the mask to be used are pre-selected, the corresponding critical dimension fingerprints are selected from the database 401 according to the selected tool and mask, and the corresponding critical dimension fingerprints are combined to form a total critical dimension fingerprint.

In the embodiment of the present application, the total critical dimension fingerprint is the AEI CD fingerprint formed after exposing and etching the wafer. In FIG. 3, step 2 corresponds to step S206. AEI CD data obtained in step S206 is obtained by combining the critical dimension fingerprints in the database 401. Taking the combination related to the ETCH tool 203c in FIG. 4 as an example, the following description will be made:

In FIG. 4, ADI inter CD fingerprint 402a represents the critical dimension fingerprint of the LITHO tool 201a, ADI inter CD fingerprint 402b represents the critical dimension fingerprint of the LITHO tool 201b, and ADI inter CD fingerprint 402c represents the critical dimension fingerprint of the LITHO tool 201c. ADI intra CD fingerprint 403a represents the critical dimension fingerprint of the mask 202a, and ADI intra CD fingerprint 403b represents the critical dimension fingerprint of the mask 202b.

In addition to the AEI CD 204a, the AEI CD data corresponding to the other five combinations in FIG. 4 are as follows:

The ADI inter CD fingerprint 402a, the ADI intra CD fingerprint 403b and the AEI inter CD fingerprint 404c are combined to form AEI CD 204b.

The ADI inter CD fingerprint 402b, the ADI intra CD fingerprint 403a and the AEI inter CD fingerprint 404c are combined to form AEI CD 204c.

The ADI inter CD fingerprint 402b, the ADI intra CD fingerprint 403b and the AEI inter CD fingerprint 404c are combined to form AEI CD 204d.

The ADI inter CD fingerprint 402c, the ADI intra CD fingerprint 403a and the AEI inter CD fingerprint 404c are combined to form AEI CD 204e.

The ADI inter CD fingerprint 402c, the ADI intra CD fingerprint 403b and the AEI inter CD fingerprint 404c are combined to form AEI CD 204f.

The superposition calculation method of combining the critical dimension fingerprints to form the total critical dimension fingerprint may be adjusted according to the actual situation.

In step 3, DOMA data for exposure of the wafer is obtained according to the total critical dimension fingerprint.

The method of generating the DOMA data for the exposure of the wafer according to the total critical dimension fingerprint may be adjusted according to the actual situation.

FIG. 4 illustrates five dose recipes related to DOMA data obtained through the total critical dimension fingerprint, including dose recipe 205b obtained through AEI CD 204b, dose recipe 205d obtained through AEI CD 204c, dose recipe 205d obtained through AEI CD 204d, dose recipe 205e obtained through AEI CD 204e, and dose recipe 205f obtained through AEI CD 204f. In some embodiments, step 3 corresponds to step 207 to step S208 in FIG. 3, in step S207, CD analysis is performed according to the AEI CD data; in step S208, the CD analysis result in step S207 and the dose sensitivity 405 are combined to obtain a Dose Recipe. The DR corresponds to the DOMA file. Then, DOMA is performed according to the DR.

In step 4, the wafer is exposed, and the exposure of the wafer is corrected according to the DOMA data in an exposure process of the wafer. The exposure corresponding to step 4 is exposure corrected by DOMA, which can improve AEI CDU. Step 4 corresponds to step S202 according to the corrected dose in FIG. 3.

The embodiment of the present application collects the critical dimension fingerprints of each tool and mask in advance, so that the corresponding critical dimension fingerprints can be selected from the database 401 according to the selected tool and mask in advance before exposure, and the selected critical dimension fingerprints can be combined to form the total critical dimension fingerprint. The DOMA data can be obtained through the total critical dimension fingerprint, so that a DOMA data file can be generated quickly and easily.

Especially when a new tool or mask needs to be expanded, different from the DOMA data file that requires multiple combination tests between the new tool or mask and other tools or masks in the prior art, the embodiment of the present application only needs to calculate the critical dimension fingerprint of the added tool or mask to generate the DOMA data file related to the new tool or mask, thus improving the efficiency of generating DOMA data file and improving the production capacity.

The present application has been described in detail through specific embodiments, which, however, do not form limitations to the present application. Without departing from the principle of the present application, those skilled in the art may make many modifications and improvements, which should also be regarded as the scope of protection of the present application.

What is claimed is:

1. A dose mapper method, wherein the dose mapper method comprises the following steps:
   step 1: provide tools and masks, wherein the tools comprise LITHO tools and ETCH tools, wherein a number of the LITHO tools is more than one, a number of the ETCH tools is more than one, and a number of the masks is more than one;
   collecting critical dimension fingerprints of each tool and each mask and storing the collected critical dimension fingerprints in a database, wherein a critical dimension fingerprint of each LITHO tool and a critical dimension fingerprint of each mask are obtained through the following steps:
      step 1.1: selecting one LITHO tool and one mask, and performing exposure and development to obtain corresponding ADI CD data;
      step 1.2: decomposing the obtained ADI CD data to obtain a critical dimension fingerprint of the selected one LITHO tool and the critical dimension fingerprint of the selected one mask; and
      step 1.3: changing a combination of the selected one LITHO tool and the selected one mask, repeating steps 1.1-1.2 until critical dimension fingerprints of all LITHO tools and all masks are obtained, and storing the critical dimension fingerprints in the database;
   step 2: before exposing a wafer, pre-selecting a tool and a mask to be used, selecting corresponding critical dimension fingerprints from the database according to the pre-selected tool and mask, and combining the corresponding critical dimension fingerprints to form a total critical dimension fingerprint;
   step 3: obtaining dose mapper data for exposure of the wafer according to the total critical dimension fingerprint; and
   step 4: exposing the wafer, and correcting the exposure of the wafer according to the dose mapper data in an exposure process of the wafer.

2. The dose mapper method according to claim 1, wherein, when there is a newly added LITHO tool, a critical dimension fingerprint of the newly added LITHO tool is obtained separately by using the newly added LITHO tool as the selected one LITHO tool, and repeating steps 1.1-1.2 to obtain the critical dimension fingerprint of the newly added LITHO tool.

3. The dose mapper method according to claim 1, wherein, when there is a newly added mask, a critical dimension fingerprint of the newly added mask is obtained separately by using the newly added mask as the selected one mask, and repeating steps 1.1-1.2 to obtain the critical dimension fingerprint of the newly added mask.

4. The dose mapper method according to claim 1, wherein a critical dimension fingerprint of each ETCH tool is obtained through the following steps:
   step 1.4: arbitrarily selecting one LITHO tool that the critical dimension fingerprint has been obtained and arbitrarily selecting one mask that the critical dimension fingerprint has been obtained;
   step 1.5: performing exposure and development by using the selected one LITHO tool and the one mask, then performing etching by using a selected ETCH tool after development, and obtaining corresponding AEI CD data;
   step 1.6: removing the critical dimension fingerprint of the selected one LITHO tool and the critical dimension fingerprint of the selected one mask from the obtained AEI CD data to obtain the critical dimension fingerprint of the selected ETCH tool; and
   step 1.7: changing the selected one LITHO tool, repeating steps 1.4-1.6 or repeating steps 1.5-1.6 until critical dimension fingerprints of all ETCH tools are obtained, and storing the obtained critical dimension fingerprints in the database.

5. The dose mapper method according to claim 4, wherein, when there is a newly added ETCH tool, the newly added ETCH tool is used as the selected one LITHO tool, and steps 1.4-1.6 or steps 1.5-1.6 are repeated until the critical dimension fingerprint of the newly added ETCH tool is obtained.

6. The dose mapper method according to claim 1, wherein, in step 2, the total critical dimension fingerprint is an AEI CD fingerprint formed after exposing and etching the wafer.

* * * * *